United States Patent [19]

Cleary, Jr. et al.

[11] 4,105,932
[45] Aug. 8, 1978

[54] "SLEWED PULSE" SCOPE SWEEP CALIBRATOR

[75] Inventors: Edward Joseph Cleary, Jr., Beaverton; Michael Goodwin Reiney, Tigard, both of Oreg.

[73] Assignee: Tektronix, Inc., Beaverton, Oreg.

[21] Appl. No.: 744,559

[22] Filed: Nov. 24, 1976

[51] Int. Cl.² ............................................. G01R 13/30
[52] U.S. Cl. ................................. 315/377; 315/409; 324/88; 324/183; 328/188
[58] Field of Search ............... 315/377, 409; 324/88, 324/183; 328/186, 188, 189; 340/324 A

[56] References Cited

U.S. PATENT DOCUMENTS

| | | | |
|---|---|---|---|
| 2,438,420 | 3/1948 | Scoles et al. | 315/377 |
| 2,504,852 | 4/1950 | Lewis | 315/377 |
| 3,076,120 | 1/1963 | Matthews et al. | 315/377 |
| 3,430,098 | 2/1969 | Stok | 315/392 |
| 3,500,115 | 3/1970 | Auger, Jr. | 315/393 |

Primary Examiner—Maynard R. Wilbur
Assistant Examiner—Lawrence Goodwin
Attorney, Agent, or Firm—George T. Noe

[57] ABSTRACT

A slewed-pulse display is provided for calibrating the time-base axis of an oscilloscope. In a repetitive-sweep display, the leading edges of incrementally delayed successive pulses are slewed across the display screen. Timing and linearity adjustments may be made in the time-base generator circuits so that a leading edge of a pulse is aligned with each vertically scribed graticule line overlaying the display area.

14 Claims, 4 Drawing Figures

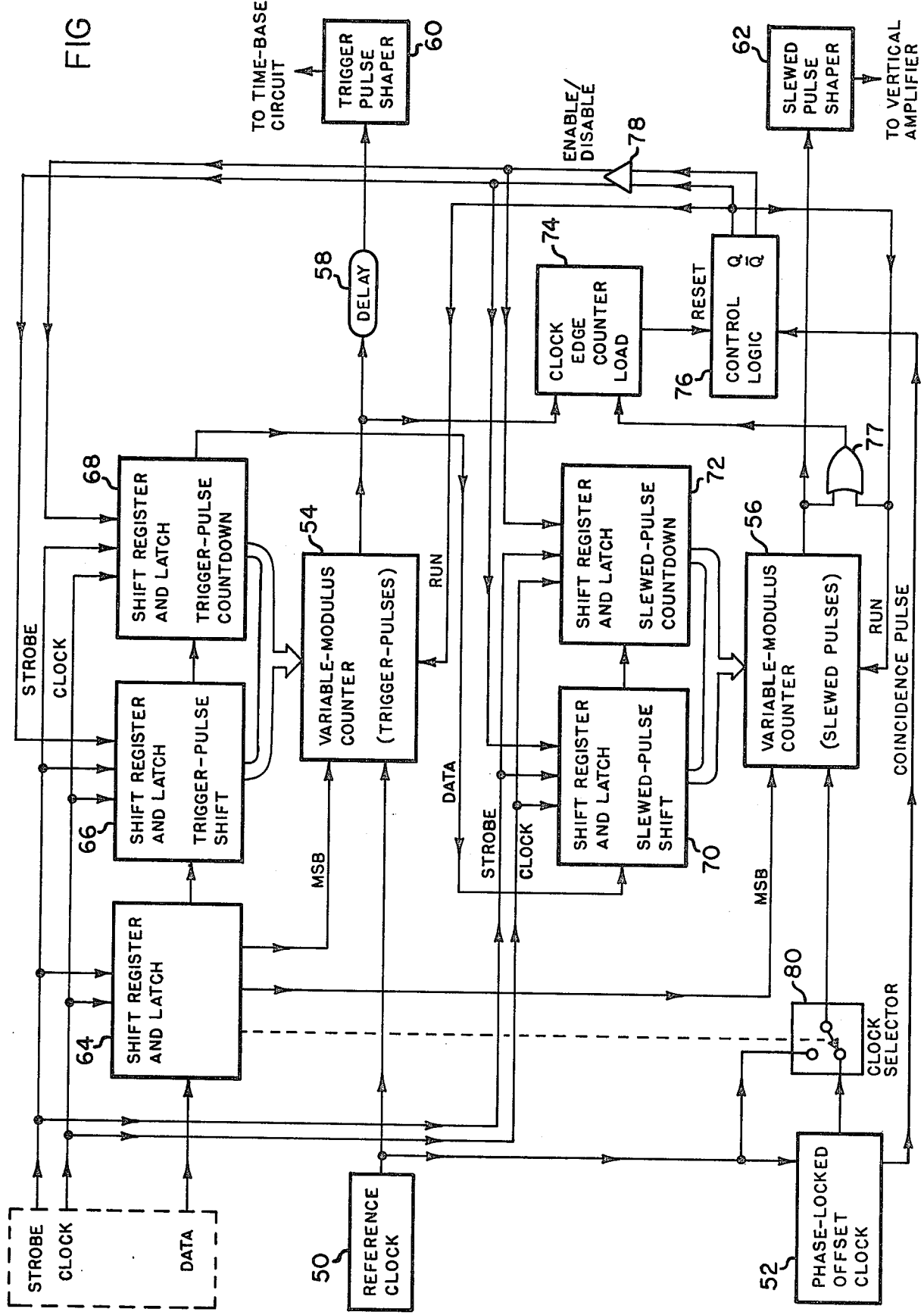

"SLEWED PULSE" SCOPE SWEEP CALIBRATOR

BACKGROUND OF THE INVENTION

The traditional method of calibrating the time-base axis of a measurement instrument, such as an oscilloscope, has been to apply a signal having known frequency characteristics to the vertical axis of the instrument. Typically, these signals are precise time markers, square waves, or sine waves generated by a separate instrument. The appropriate timing and linearity adjustments are then made in the time-base circuit to provide a reasonably accurate sweep rate. This method of calibration has been adequate because the time base of a given oscilloscope has been compatible with a bandwidth or rise time thereof. That is, no faster sweep rate was provided then that which would provide an undistorted display of a signal passed through the associated vertical amplifier system.

The current digital trends and the analysis of logic signals have necessitated faster and more precise sweep signals, while less emphasis has been placed on bandwidth or rise time. It is commonplace today to find oscilloscopes having bandwidths on the order of 100 to 200 megahertz and time-base sweep rates on the order of 1 to 0.5 nanoseconds per graticule division. Calibration or accuracy checks of these time bases is difficult using present methods because the vertical amplifier channels simply do not have the capability of passing calibration signals having a frequency of 1 or 2 gigahertz.

SUMMARY OF THE INVENTION

In accordance with the present invention, the leading edges of incrementally delayed successive pulses are repetitiously slewed across a display screen, thereby providing a novel sweep calibration method and apparatus which obviates the need to attempt to display signals such as sine waves having frequencies which far exceed the bandwidth capability of the oscilloscope or waveform monitoring device.

A reference clock signal is utilized for developing trigger pulses for triggering a sweep generator circuit associated with the horizontal deflection circuits of an oscilloscope, and such triggering pulses have a predetermined period between leading edges thereof which is greater than a complete sweep cycle so that the sweep circuits can reset completely before a new sweep is initiated. A slewing-pulse signal is derived from the reference signal and applied to the vertical deflection circuits so that the leading edges thereof are displayed on the oscilloscope screen. The slewing pulses have a predetermined period which is chosen to be longer than the trigger pulse period by a precise time interval, such as that represented by one graticule division of oscilloscope timing. As is well known in the oscillography art, a graticule is a scale overlaying the display area, providing a grid of equally spaced horizontal and vertical lines from which amplitude and timing measurements, respectively, may be accurately made. Typically, a graticule has eleven vertical lines to divide the horizontal, or sweep, axis into ten equal divisions.

In operation, the leading edge of the first slewing pulse occurs in the display at the left edge of the graticule at the start of the first sweep. The second leading edge occurs at the first graticule division on the second sweep. The third leading edge occurs at the second graticule division on the third sweep, and so forth, so that the leading edges of incrementally delayed successive pulses are slewed across the display screen whereby a leading edge is displayed at each graticule division. When a slewing cycle is completed, the process is repeated as described hereinabove so that a repetitive display is provided. The sweep rate, or timing, control of the sweep-generating circuit may be adjusted to provide precise alignment of the successive leading edges with vertical graticule lines. Means are provided for locking the triggering signal and slewing signal in phase at the start of each slewing cycle so that the leading edge of the slewing signal is coincident with the sweep start. The slewing signal rise time may be faster than the oscilloscope rise time; however, this is not a limiting factor because the leading edge of each slewing pulse will be identically distorted so that the apparent time intervals between corresponding points on successive leading edges are equal. Scaling means are provided for dividing down the reference clock signal and the slewing signal so that different sweep rates may be calibrated to the oscilloscope graticule. The scaling means may be operated under program control from a microprocessor or the like.

As an additional feature, a deviation from standard measurement may be provided where in the case of sweep nonlinearities one or more of the successive leading edges may not coincide with respective graticule lines. A variable-interval mode may be selected to change the time interval between successive leading edges so that they are coincident with the graticule lines, with the time difference between the calibrated and variable interval settings being read out digitally.

It is therefore one object of the present invention to provide a novel sweep calibration method and apparatus in which the leading edges of incrementally delayed successive pulses are slewed across the display screen in alignment with the graticule scale divisions.

It is another object to provide a method and apparatus for accurately calibrating sweep rates of an oscilloscope in which the maximum sweep speed is faster than the rise time of the associated vertical deflection system.

It is a further object to provide a method and apparatus for calibrating fast sweep speeds of an oscilloscope without requiring expensive high speed associated test equipment.

It is yet another object to provide a calibrating system in which a deviation from standard may be read out digitally.

Other objects and advantages will become apparent to those having ordinary skill in the art upon a reading of the following description when taken in conjunction with the accompanying drawings.

BRIEF DESCRIPTION OF THE DRAWINGS

FIG. 3 is a detailed circuit diagram of a sweep calibration apparatus according to the present invention.

DETAILED DESCRIPTION OF THE INVENTION

Figure 1:
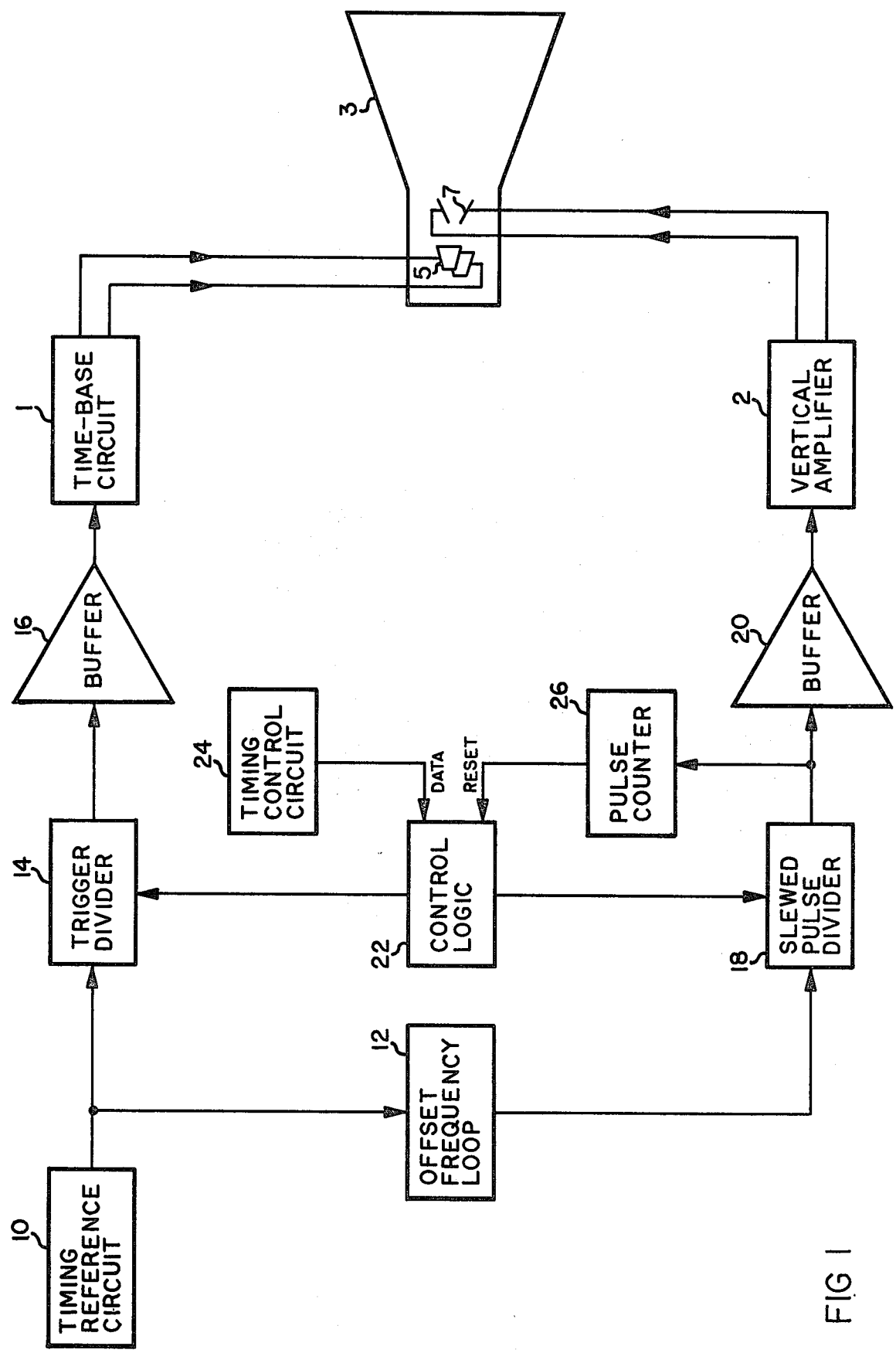
FIG. 1 shows an overall block diagram of a sweep calibration apparatus in accordance with the present invention.

An overall block diagram of a slewed-pulse calibration apparatus in accordance with the present invention is shown in FIG. 1. The apparatus includes a conventional time-base circuit 1, vertical amplifier 2, and cathode-ray tube (CRT) 3 shown on the right-hand side of the illustration. The time-base circuit 1 includes a sweep generator which produces sweep deflection signals at any of a plurality of selectable sweep rates. The sweep signals are amplified to levels suitable to drive a pair of horizontal deflection plates 5 to sweep the CRT beam across a viewing screen at a known rate of speed. The vertical amplifier 2 typically includes input attenuators and amplifiers to selectably scale the amplitude of an incoming signal to a level suitable to drive a pair of vertical deflection plates 7 to display such incoming signals on the aforementioned viewing screen. The time-base circuit 1, vertical amplifier 2, and CRT 3 discussed hereinabove are well known oscilloscope circuits, and their inclusion here is to facilitate understanding of the sweep calibration method and apparatus.

A timing reference circuit 10 produces clock pulses at a predetermined frequency, for example, 100 megahertz, to provide an accurate timing signal. An offset frequency loop 12 produces offset clock pulses at a frequency which is slightly offset from the reference frequency; more importantly, the period of such offset clock pulses is longer than the period of the reference clock pulses by a predetermined interval. For example, assume that the highest sweep rate of the time-base circuit 1 is 0.5 nanosecond per graticule division, and that the sweep length is 10 divisions, or 5 nanoseconds. Since the period of the reference clock pulses is 10 nanoseconds, the period of the offset clock pulses may suitably be 10.5 nanoseconds so that the time difference therebetween is 0.5 nanosecond, for reasons that will become apparent hereinafter.

The timing reference clock pulses are applied to a trigger divider circuit 14 wherein such clock pulses are counted down in accordance with a predetermined count modulus to produce trigger pulses which in turn are applied through a buffer amplifier 16 to time-base circuit 1. Similarly, the offset clock pulses are applied to a slewed-pulse divider circuit 18, wherein such clock pulses are counted down in accordance with a predetermined count modulus to produce slewed-pulse display signals which are the leading edges of such slewed pulses. The slewed pulses are applied via a buffer amplifier 20 to the vertical amplifier 2. The count modulus for dividers 14 and 18 is determined by a control logic circuit 22, which receives timing control data from a timing control circuit 24 and a reset pulse from pulse counter 26. Dividers 14 and 18 may suitably be variable-modulus counters, and timing control circuit 24 may suitably be either switch contacts or a microprocessor. It is desirable to change the countdown ratios of dividers 14 and 18 to match the timing of different sweep rates.

The offset frequency loop is preferably phase locked to the reference clock signal, and for the example given hereinabove produces 20 offset clock pulses for every 21 reference clock pulses. See the timing diagram set forth in FIG. 2B, wherein the leading edges of the clock pulses are shown simply as vertical lines, or spikes. In actuality, the clock pulses are square-wave pulses. Note that there are 21 reference clock pulses labeled $a$–$u$ 10 nanoseconds apart, and 20 offset clock pulses labeled $a'$–$t'$ 10.5 nanoseconds apart. The offset clock pulses are phase locked with the reference clock pulses at $a$–$a'$.

Figure 2A:
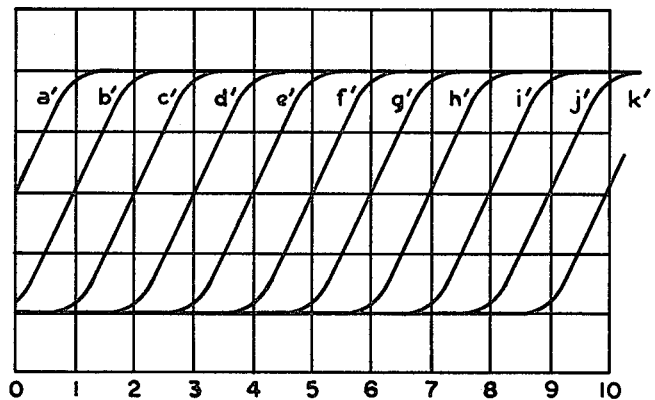
FIG. 2A shows a waveform display of slewed calibration pulses on a CRT viewing screen.
Figure 2B:
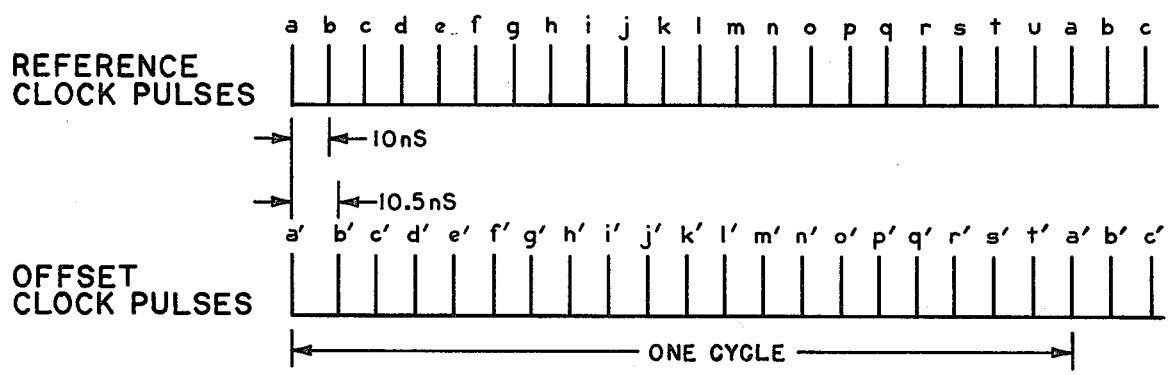
FIG. 2B is a timing diagram showing the relationship between triggering and slewing pulses as produced by reference clock pulses and offset clock pulses respectively.

With reference to FIGS. 2A and 2B, and the 0.5 nanosecond per division sweep rate mentioned hereinabove, operation is as follows: Corresponding to reference clock pulse $a$, a triggering pulse is developed to initiate a sweep signal to be applied to horizontal deflection plates 5. Simultaneously therewith, the leading edge of a slewed pulse corresponding to offset clock pulse $a'$ is displayed on screen at the left edge of the graticule. This can be seen in FIG. 2A, which represents the viewing screen of an oscilloscope or the like, wherein the leading edge of waveform $a'$ begins at the 0th vertical line at the left edge of the graticule and rises to its peak level, and then continues toward the right before finally going off screen after passing the 10th vertical line. Dividers 14 and 18 continue to count clock pulses in accordance with predetermined moduli, which may be several of the complete $a$–$u$ cycles shown in FIG. 2B, while the sweep circuits reset. At the end of the predetermined counts, divider 14 outputs a trigger pulse corresponding to reference clock pulse $b$ to initiate a second sweep. Half a nanosecond later, divider 18 outputs a slewed pulse corresponding to offset clock pulse $b'$, which is displayed on screen at the first vertical line. If the risetime of the leading edge is limited by the bandwidth of amplifier 2 or CRT 3, the leading edges of the displayed waveforms will be identically distorted as shown. In this case the display position controls may be adjusted to establish a reference line, for example, the center horizontal graticule line, from which to make the calibration measurement as shown. As can be discerned, the time difference between pulses $c$ and $c'$ is 1 nanosecond, between pulses $d$ and $d'$, 1.5 nanosecond, between pulses $e$ and $e'$, 2 nanoseconds, etc., so that the leading edges of incrementally delayed successive pulses are slewed across the display screen whereby a leading edge is displayed at each graticule division. Pulse counter 26 counts the slewed pulses and when a slewing cycle is complete, for example, after 11 slewed pulses, resets the control logic circuit 22 so that the next slewing cycle will begin at $a$–$a'$. The process is repeated as described hereinabove so that a repetitive display is provided. For different sweep rates, the count moduli of dividers 14 and 18 may be scaled accordingly. For example, if a sweep rate of one nanosecond per division is chosen, pulses $a$–$a'$, $c$–$c'$, $e$–$e'$, etc., may be utilized as the activating pulses. Calibration is effected by adjusting the sweep timing in the conventional manner to align the leading edges of the display pulses with the vertical graticule lines.

FIG. 3 shows a detailed circuit diagram of a sweep calibration apparatus for producing triggering pulses and slewed display pulses in accordance with a commercial embodiment of the present invention. A reference clock 50, which may suitably be a voltage-controlled oscillator, produces reference clock pulses at a frequency of 100 megahertz to provide an accurate timing reference signal. A phase-locked offset clock 52 produces offset clock pulses at a frequency of 95.238 megahertz, or $(20/21) \times 100$ MHz. The phase-locked offset clock 52 may suitably be a phase-locked loop including a voltage-controlled oscillator and frequency dividers which receives the 100-megahertz reference signal and produces therefrom an offset clock-pulse signal which is periodically locked in phase with such reference signal. The waveform display and timing relationships of FIGS. 2A and 2B therefore apply to the apparatus of FIG. 3 as well as previously discussed for FIG. 1.

The reference clock pulses and offset clock pulses are applied to variable-modulus counters 54 and 56 respectively. The variable-modulus counters may suitably comprise commercially available 10136 counters which produce output pulses in accordance with programmable predetermined counts. The trigger pulses from counter 54 may be applied via a delay line 58 to a trigger pulse shaper 60, while the slewed pulses from counter 56 are applied to a slewed pulse shaper 62. Pulse shapers 60 and 62 may suitably be some form of high-speed switches, such as comparators or flip-flops, to provide fast, clean pulse edges for utilization by the display circuitry. The purpose of delay line 58, if provided, is to compensate the delay built into the associated vertical amplifier to facilitate internal triggering. In display monitors and the like which have no internal triggering capability, no delay line 58 is necessary and therefore the output of counter 54 may be coupled directly to trigger pulse shaper 60. As an alternative, any required delay may be programmed into the variable-modulus counters. The output of trigger pulse shaper 60 may be coupled to a time base circuit for triggering the sweep circuits thereof, while the output of slewed pulse shaper 62 may be coupled to a vertical amplifier circuit for display on an associated CRT screen as discussed previously in connection with FIG. 1.

Programmable countdown moduli for the variable-modulus counters 54 and 56 is provided by storage registers 64, 66, 68, 70 and 72. The parallel-data outputs of registers 66 and 68 are wired together and connected to the modulus data inputs of counter 54 so that a "shift" and a "countdown" modulus are provided therefor. Similarly, the parallel-data outputs of registers 70 and 72 are wired together and connected to the modulus data inputs of counter 56. Storage register 64 provides the most significant bit (MSB) to both counters 54 and 56 for establishing the moduli thereof. Registers 64, 66, 68, 70, and 72 may suitably be commercially available latchable shift registers, such as CD4094 shift registers. Serial data from an external source, such as a microprocessor or the like, is located into the registers. Clock signals and strobe signals are also provided by such external source whereby the serial data is shifted through the registers in accordance with the clock signal to establish the appropriate parallel moduli data, at which point such data is stored in the latches upon receipt of a strobe pulse, and thereafter, the data is available to the counters 54 and 56.

Start commands for variable-modulus counters 54 and 56, and enable and disable control of storage registers 66, 68, 70 and 72 are provided by a counter control circuit which includes and edge counter 74 and a control logic circuit 76. Edge counter 74 may suitably be any commercially available counter capable of counting clock pulses in accordance with a predetermined preloaded count and producing an output pulse such as that provided by an overflow upon completion of such count. Once such available counter is 74LS191, which is a synchronous up-down binary counter with a mode control. In this circuit the mode control of edge counter 74 is permanently wired to a high logic level so that the counter will count down, and the data inputs are connected to appropriate logic levels to provide a predetermined countdown modulus. Control logic circuit 76 may suitably include a clocked J-K flip-flip. Assuming an initial condition wherein the Q output of control logic circuit 76 is low, variable-modulus counters 54 and 56 are inhibited, and the output of OR gate 77 is low. The application of a logical low to the load input of edge counter 74 permits the predetermined count modulus data to be input; for example, the edge counter utilized in this embodiment has four data inputs, all of which are wired high, so that a count modulus of 15 (8+4+2+1) is entered upon a load command. The next coincidence pulse from the phase-locked offset clock 52, which occurs at $a$-$a'$ in FIG. 2, is applied to the clock input of logic control circuit 76, causing the Q output to go high and the $\overline{Q}$ output to go low. The high logic level from the Q output of control logic circuit 76 is applied as a "run" command to activate variable-modulus counters 54 and 56, and such high logic level is simultaneously applied via OR gate 77 to the load input of edge counter 74 to remove the load command, setting up the edge counter to begin its countdown. The variable-modulus counters 54 and 56 produce trigger pulses and display pulses respectively by counting down clock pulses as discussed previously, and each trigger pulse thereby produced is applied to the clock input of edge counter 74. After 15 such trigger pulses, an overflow output from edge counter 74 is applied to the reset input of control logic circuit 76, forcing the Q output thereof to go low, inhibiting the variable-modulus counters 54 and 56, and applying a new load command via OR gate 77 to edge counter 74. This describes a complete slewing cycle, and the process will be repeated upon the next coincidence pulse applied from the offset clock 52 to the control logic circuit 76.

As mentioned hereinabove, the control logic circuit also provides the enable-disable control of storage registers 66, 68, 70 and 72. The Q and $\overline{Q}$ outputs of control logic circuit 76 are applied to the inputs of a TTL buffer stage or comparator 78. The outputs from such comparator 78 are applied to the enable inputs of the storage registers such that registers 66 and 70 are enabled when the Q output of control logic circuit 76 is low and registers 68 and 72 are enabled when the Q output of control logic circuit 76 is high. In other words, while the variable-modulus counters 54 and 56 are inhibited prior to a slewing cycle, the moduli therefor are established by the enabled storage registers 66 and 70; and when the variable-modulus counters 54 and 56 are enabled, the moduli therefor are established by the enabled storage registers 68 and 72. Thus the initial triggering pulse and display edge of a particular slewing cycle are determined by the data stored in registers 66 and 70, and subsequent triggering pulses and display edges are produced in accordance with the moduli data stored in registers 68 and 72. Therefore, it can be seen that a slewing does not necessarily need to occur at the time $a$-$a'$ shown in FIG. 2, although for normal sweep calibration the programming may be established to begin the slewing cycle at $a$-$a'$. For magnified sweep and delayed sweep applications, however, it may be advantageous to start a slewing cycle after a predetermined delay so that the display edges are produced during the on-screen portion of the sweep. Storage registers 66 and 70 are then utilized to "shift" the starting trigger pulse and starting slewed pulse to provide the appropriate delay, after which storage registers 68 and 72 provide the moduli data to ensure a slewed-sweep display at the chosen sweep rate. For example, suppose a 5 nanosecond per division sweep rate is chosen and the 10 times sweep magnification is utilized, resulting in an actual sweep rate of 0.5 nanosecond per division. Suppose further that the display of the magnified sweep begins 4 nanoseconds after the actual sweep start. Storage registers 66 and 70 cause the sweep initiating pulses to shift from a–a', to i–i', after which the sequence is j–j', k–k', l–l', m–m', etc.

A clock selector 80 is provided to permit a selection of clock pulses from either reference clock 50 or offset clock 52 for production of the slewed display pulses. At sweep rates of 10 nanoseconds per division and slower, the 10-nanosecond reference clock signal may be applied to both variable-modulus counters 54 and 56, with such counters programmed to count down in predetermined multiples of 10 nanoseconds between the trigger pulse and slewed display pulse. Such clock selector 80 may suitably be an arrangement of logic gates controlled by shift register 64 to set up the desired routing.

It will, therefore, be appreciated that the aforementioned and other desirable objects have been achieved; however, it should be noted that the particular embodiment of the invention which is shown and described herein is intended as merely illustrative and not as restrictive of the invention.

We claim:

1. A method of calibrating the time-base sweep of a display device, comprising:
   generating a reference signal having a predetermined frequency;
   deriving trigger signals from said reference signal to initiate said time-base sweep thereon;
   deriving display signals from said reference signal in timed relationship with said trigger signals so that each successive display signal is incrementally delayed from each successive trigger signal by a predetermined interval to provide a predetermined slewing rate; each of said trigger signals initiating a time-base sweep against which a said successive display signal is displayed; and
   adjusting the time base sweep rate timing to match the slew rate of said successive display signals.

2. A system for providing sweep rate calibration signals for a display device, comprising:
   timing reference means for generating a reference signal having a predetermined frequency; and
   means responsive to said reference signal for producing trigger signals and display signals in timed relationship wherein the period of said display signals is greater than the period of said trigger signals by a predetermined interval so that each successive display signal is incrementally delayed with respect to said trigger signals, each of said trigger signals initiating a time-base sweep against which a said successive display signal is displayed.

3. A system in accordance with claim 2 wherein said timing reference means comprises a reference clock circuit.

4. A system in accordance with claim 2 wherein said means responsive to said reference signal includes first countdown circuit means and second countdown circuit means, said first countdown circuit means producing said trigger signals in accordance with a first predetermined count modulus, and said second countdown circuit means producing said display signals in accordance with a second predetermined count modulus.

5. A system in accordance with claim 4 further including offset clock means interposed between said timing reference means and said second countdown circuit means, said offset clock means producing a second timing signal having a frequency which is offset from the frequency of said reference signal by a predetermined fraction.

6. A system in accordance with claim 4 wherein said means responsive to said reference signal further includes a logic control circuit operatively connected to said first countdown circuit means and said second countdown circuit means, said logic control circuit enabling said first and second countdown circuit means when said trigger signals and said display signals are coincident, and disabling said countdown circuit means after a predetermined number of signals have been produced therefrom.

7. A system in accordance with claim 4 wherein said first and second countdown circuit means comprise first and second programmable variable-modulus counters.

8. A system in accordance with claim 7 further including timing control means connected to said first and second variable-modulus counters for establishing the countdown moduli thereof.

9. In an oscilloscope having a time-base generator, a vertical amplifier, and a cathode-ray tube having a display screen for displaying waveforms thereon, a sweep calibration apparatus comprising:
   means for generating a reference signal having a predetermined frequency;
   means for deriving trigger signals from said reference signal and applying said trigger signals to said time-base generator, each of said trigger signals initiating a time-base sweep; and
   means for deriving display signals from said reference signal in timed relationship with said trigger signals so that each successive display signal is incrementally delayed from each successive trigger signal by a predetermined interval to provide a predetermined slewing rate, said display signals being applied to said vertical amplifier to be displayed on said display screen.

10. An apparatus in accordance with claim 9 wherein said means for deriving trigger signals and said means for deriving display signals include first and second divider circuit means respectively, said divider circuit means dividing down said reference signal in accordance with predetermined count moduli.

11. An apparatus in accordance with claim 10 further including logic control means operatively connected to said first and second divider means, said logic control means enabling said first and second divider means when said trigger signals and said display signals are coincident, and disabling said divider means after a predetermined number of signals have been produced therefrom.

12. An apparatus in accordance with claim 10 further including timing control means for providing said predetermined count moduli.

13. An apparatus in accordance with claim 12 wherein said timing control means includes a plurality of shift registers operatively connected to said first and second divider circuit means for providing a plurality of selectable count moduli therefor.

14. An apparatus in accordance with claim 9 wherein said means for deriving display signals includes offset clock means for producing a second timing signal having a frequency which is offset from the frequency of said reference signal by a predetermined amount so that said display signals are produced in accordance with said second timing signal.

* * * * *